(12) United States Patent
Wang et al.

(10) Patent No.: US 11,456,850 B2
(45) Date of Patent: Sep. 27, 2022

(54) ASYNCHRONOUS SAMPLING ARCHITECTURE AND CHIP

(71) Applicant: SHENZHEN GOODIX TECHNOLOGY CO., LTD., Shenzhen (CN)

(72) Inventors: Wen-Chi Wang, Shenzhen (CN); Hsin-Min Wang, Shenzhen (CN); Ju-Chieh Liu, Shenzhen (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 26 days.

(21) Appl. No.: 17/134,215

(22) Filed: Dec. 25, 2020

(65) Prior Publication Data

US 2021/0184826 A1 Jun. 17, 2021

Related U.S. Application Data

(63) Continuation of application No. PCT/CN2019/104220, filed on Sep. 3, 2019.

(51) Int. Cl.
*H04L 7/00* (2006.01)
(52) U.S. Cl.
CPC .................. *H04L 7/0012* (2013.01)
(58) Field of Classification Search
CPC ............... H04L 7/0012; H04L 7/00
See application file for complete search history.

(56) References Cited

U.S. PATENT DOCUMENTS

| 5,056,120 A | 10/1991 | Taniguchi et al. |
| 2004/0068683 A1* | 4/2004 | Hoang ............ H04L 1/243 714/716 |
| 2015/0277482 A1* | 10/2015 | Kohzeki ............ G06F 1/324 709/224 |
| 2017/0230038 A1* | 8/2017 | Shin .............. H03K 5/14 |

FOREIGN PATENT DOCUMENTS

| CN | 101303643 A | 11/2008 |
| CN | 101329589 A | 12/2008 |
| CN | 102347830 A | 2/2012 |

(Continued)

OTHER PUBLICATIONS

English abstract for CN 101303643A.
(Continued)

*Primary Examiner* — Jamal Javaid
(74) *Attorney, Agent, or Firm* — WPAT, P.C. Intellectual Property Attorneys; Anthony King

(57) ABSTRACT

The present application discloses an asynchronous sampling architecture and a chip. The asynchronous sampling architecture is configured to receive a first input data string from the peer end, and the asynchronous sampling architecture includes: a first register, configured to buffer a first input data string, wherein the first input data string is written into the first register according to a peer end clock of the peer end; and a gated clock generation unit, configured to generate a gated clock, wherein the frequency of the gated clock is the same as the frequency of the peer end clock, and the first input data string is read out as a first output data string from the first register according to the gated clock.

16 Claims, 5 Drawing Sheets

100

(56) References Cited

FOREIGN PATENT DOCUMENTS

CN         103425614 A    12/2013
CN         103427835 A    12/2013

OTHER PUBLICATIONS

English abstract for CN 101329589 A.
English abstract for CN 102347830 A.
English abstract for CN 103425614 A.
PCT Request of PCT/CN2019/104220 as filed.
Form 237 of PCT/CN2019/104220.
Form 202 of PCT/CN2019/104220.
Form 210 of PCT/CN2019/104220.
Form 220 of PCT/CN2019/104220.
PCT/CN2019/104220 Application as filed.
Form 105 of PCT/CN2019/104220.

\* cited by examiner

ASYNCHRONOUS SAMPLING ARCHITECTURE AND CHIP

CROSS REFERENCE TO RELATED APPLICATIONS

The present disclosure is a continuation of international application No. PCT/CN2019/104220, filed on Sep. 3, 2019, which is hereby incorporated by reference in its entirety.

TECHNICAL FIELD

The present application relates to an asynchronous sampling architecture and a chip; in particular, to an asynchronous sampling architecture and a chip using the $\Sigma$-$\delta$ modulation.

BACKGROUND

In communication systems, the information transfer between systems is often faced with the problem of asynchronous clocks; that is, the clocks between systems are independent of each other and asynchronous, resulting in unpredictable differences in data rates between the local and the peer end; therefore, asynchronous sampling is a very important technology in communication systems. Current practices, such as using asynchronous sampling rate converters to resample the signal with the local clock, is more complex in terms of hardware structure and power-intensive; hence, it has become an important task in the related field to achieve both power-saving and acceptable performance for applications that emphasize power saving.

SUMMARY OF THE INVENTION

One purpose of the present application is to disclose an asynchronous sampling architecture and chip to address the above-mentioned issues.

One embodiment of the present application discloses an asynchronous sampling architecture, which is configured to receive a first input data string from a peer end, wherein the asynchronous sampling architecture includes: a first register, configured to buffer the first input data string, wherein the first input data string is written into the first register according to the peer end clock of the peer end; and a gated clock generation unit, configured to generate a gated clock, wherein the frequency of the gated clock is the same as the frequency of the peer end clock, and the first input data string is read from the first register as a first output data string according to the gated clock.

One embodiment of the present application discloses a chip, which includes the above-mentioned asynchronous sampling architecture.

The embodiments of the present application improve the asynchronous sampling architecture to reduce the cost and power consumption.

DETAILED DESCRIPTION

Figure 1:
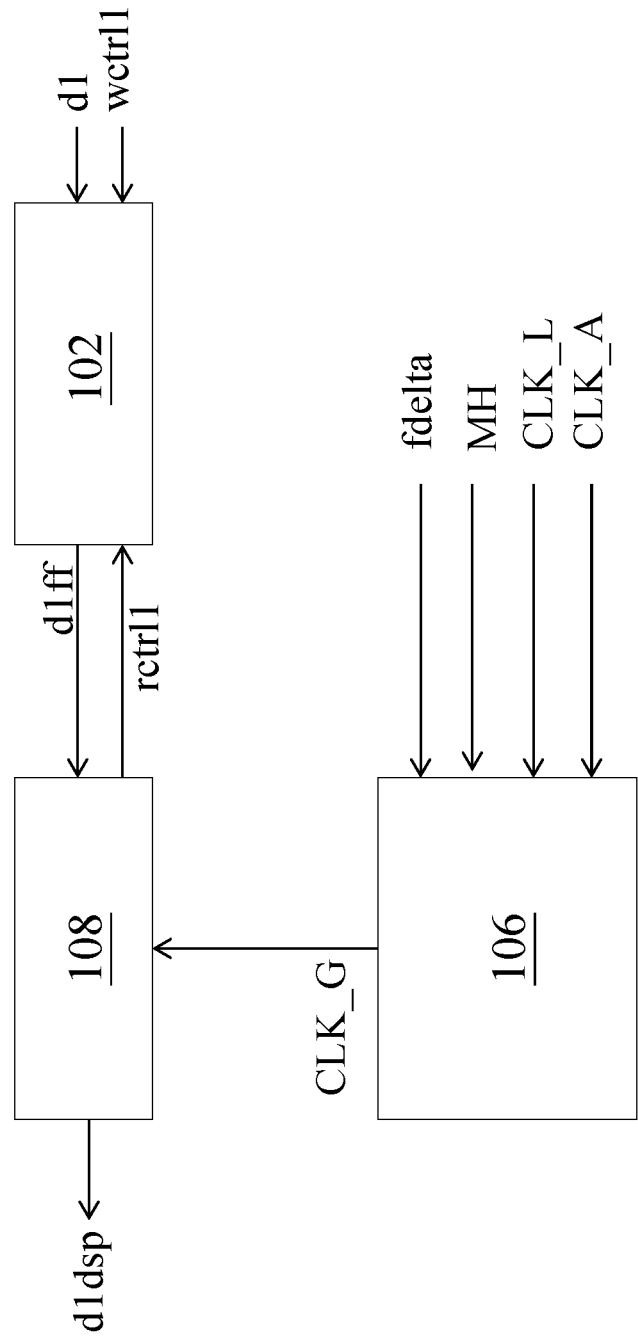
FIG. 1 is a schematic diagram illustrating an asynchronous sampling architecture according to the first embodiment of the present application.

The following disclosure provides many different embodiments, or examples, for implementing different features of the invention. Specific examples of components and arrangements are described below to simplify the present disclosure. As could be appreciated, these are, of course, merely examples and are not intended to be limiting. For example, the formation of a first feature over or on a second feature in the description that follows may include embodiments in which the first and the second features are formed in direct contact, and may also include embodiments in which additional features may be formed between the first and the second features, such that the first and the second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for the case of the description to describe one element or feature's relationship with respect to another element(s) or feature(s) as illustrated in the drawings. The spatially relative terms are intended to encompass different orientations of the device in use or operation in addition to the orientation depicted in the figures. The apparatus may be otherwise oriented (e.g., rotated by 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. As could be appreciated, other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed considering the number of reported significant digits and by applying ordinary rounding techniques. Ranges can be expressed herein as from one endpoint to another endpoint or between two endpoints. All ranges disclosed herein are inclusive of the endpoints unless specified otherwise.

In communication systems, it is often that the information is transferred between two or more systems, wherein the frequency of each system differs from one another, which is referred to as frequency asynchronous. If such frequency difference is not properly handled, some problems may occur when transferring the information. For example, specifications for audio signals have many different frequency standards, such as 32 kHz, 44.1 kHz, 48 kHz, etc.; hence, sampling rate conversion of signals is a commonly used technology for processing audio signals; the so-called sampling rate conversion means changing the sampling rate of the signal. There are two types the sampling rate conversion, the synchronous sampling rate conversion and asynchronous sampling rate conversion. The synchronous sampling rate conversion means the bit rate clocks before and after the conversion are synchronous, wherein the ratio between the bit rates is a constant; the asynchronous sampling rate conversion means the bit rate clocks before and after the conversion are asynchronous and independent, wherein the ratio of the bit rates changes slowly with the time, which also means that the ratio between the bit rates may be an irrational number, and thus cannot be implemented using general interpolation filters with a fix magnification. Current practices, such as using asynchronous sampling rate converters for complex interpolation, are more complex in terms of hardware structure and power-intensive; hence, it has become a tremendous challenge in the related field to achieve both power-saving and acceptable performance for applications that emphasize power saving.

FIG. 1 is a schematic diagram illustrating an asynchronous sampling architecture according to the first embodiment of the present application. The asynchronous sampling architecture 100 shown in FIG. 1 is configured to receive a first input data string d1 from a peer end (not shown in the drawings) and perform an asynchronous data sampling, wherein the peer end generates a write control signal wcrtl1 according to the peer end clock CLK_P, and writes the first input data string d1 into a first register 102 of the asynchronous sampling architecture 100 according to the write control signal wcrtl1, and there is a first frequency difference fp−fl between the frequency fp of the peer end clock CLK_P and the frequency fl of the local clock CLK_L. In the present embodiment, the first frequency difference between the frequency fp of the peer end clock CLK_P and the frequency fl of the local clock CLK_L is not the result of a design choice but an issue that is experienced inevitably. The reason for the existence of the first frequency difference is that, for example, the peer end clock CLK_P and the local clock CLK_L are generated directly or indirectly from different crystal oscillators; even though the peer end clock CLK_P and the local clock CLK_L have the same target frequency in theory, but in fact, using different crystal oscillators will undoubtedly causes the difference, and hence, there will more or less be some differences between the frequency fp of the peer end clock CLK_P and the frequency fl of the local clock CLK_L.

The asynchronous sampling architecture 100 includes: a first register 102, a gated clock generation unit 106 and a digital signal processing unit 108, for example, in the present embodiment, the first register 102 is configured to buffer the first input data string d1, and the first register 102 is a first-in-first-out register. The asynchronous sampling architecture 100 receives the first input data string d1 and writes the first input data string d1 into the first register 102, the first input data string d1 is further read from the first register 102 as a first output data string d1ff; it should be noted that, since the first input data string d1 received by the asynchronous sampling architecture 100 is transmitted from the peer end; that is, the first input data string d1 is generated according to the peer end clock CLK_P rather than the local clock CLK_L, the first input data string d1 is written into the first register 102 according to the peer end clock CLK_P of the peer end. If the local clock CLK_L is used directly to read the first input data string d1 from the first register 102, the first register 102 will inevitably experience overflow or underflow after a while. In the present embodiment, the asynchronous sampling architecture 100 does not use the local clock CLK_L but instead it reads out the first input data string d1 as the first output data string d1ff according to the read control signal rctrl1 generated by the gated clock CLK_G. Since the frequency of the gated clock CLK_G generated by the asynchronous sampling architecture 100 should be the same as the frequency of the peer end clock CLK_P, the first register 102 of the present embodiment will not experience the issue of overflow or underflow.

Figure 2:
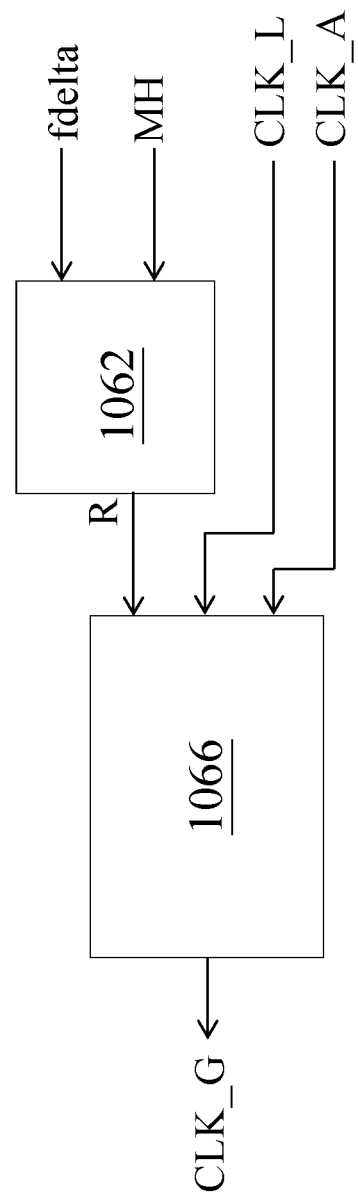
FIG. 2 is a schematic diagram illustrating a gated clock generation unit according to the embodiment of the present application.

The asynchronous sampling architecture 100 further receives a first frequency difference fdelta, wherein fdelta=the frequency fp of the peer end clock CLK_P−the frequency fl of the local clock CLK_L. The gated clock generation unit 106 of the asynchronous sampling architecture generates a gated dock CLK_G according to the first frequency difference fdelta, a pre-determined margin for frequency rise MH, the local clock CLK_L and an asynchronous sampling rate conversion clock CLK_A and supplies the same to the digital signal processing unit 108 so as to generate a read control signal rctrl1 and read the first input data string d1 from the first register 102 as the first output data string d1ff; in the present embodiment, the pre-determined margin for frequency rise MH is a pre-determined value, yet the present application is not limited thereto, and the pre-determined margin for frequency rise MH can also be supplied from an external source to the asynchronous sampling architecture 100. Moreover, the first frequency difference fdelta can be substituted with any other signals having an equivalent effect, for example, the first frequency difference fdelta can be replaced with the ratio of the frequency fp of the peer end clock CLK_P to the frequency of the local clock CLK_L, and then the first frequency difference fdelta can be obtained according to said ratio. FIG. 2 is a schematic diagram illustrating a gated clock generation unit according to the embodiment of the present application, and the drawing shows the details of the gated clock generation unit 106. As shown in FIG. 2, the gated clock generation unit 106 includes an asynchronous sampling rate conversion rate generation unit 1062 and a Σ-δ modulator 1066. In the present embodiment, the frequency fa of the asynchronous sampling rate conversion clock CLK_A is higher than that of the local clock CLK_L. Specifically, the frequency fa of the asynchronous sampling rate conversion clock CLK_A is the frequency fl of the local clock CLK_L*(1+the pre-determined margin for frequency rise MH); that is, fa−fl=fl*MH, wherein the pre-determined margin for frequency rise MH is greater than 0. In the present embodiment, the asynchronous sampling rate conversion clock CLK_A and the local clock CLK_L can be generated by a phase locked loop (not shown in the drawings).

In the present embodiment, the reason to increase the frequency of the local clock CLK_L to generate the asynchronous sampling rate conversion clock CLK_A is to generate a finer gated clock CLK_G so as to adjust the frequency fg of the gated clock CLK_G. In this case, the greater the pre-determined margin for frequency rise MH, the finer the adjustment to the frequency fg of the gated clock CLK_G, and the better the result; however, the complexity of the hardware and the power consumption increase correspondingly; in the present embodiment, the pre-determined margin for frequency rise MH is greater than 0 and less than 1; specifically, the pre-determined margin for frequency rise MH is approximately 0.1 to 0.2, yet the present application is not limited thereto, and shall depend on the actual application.

The asynchronous sampling rate conversion rate generation unit 1062 generates the asynchronous sampling rate conversion rate R according to the first frequency difference fdelta and the pre-determined margin for frequency rise MH. For example, the asynchronous sampling rate conversion rate R=(fp/fl)/(1+MH), (1+fdelta/fl)/(1+MH). Since the first frequency difference (delta is often quite close to 0 (in ppm (1+fdelta/fl) approaches 1; and accordingly, as long as the pre-determined margin for frequency rise MH does not approach 0, the pre-determined margin for frequency rise MH can make the asynchronous sampling rate conversion rate R not equal to 1 and has a certain difference from 1; if the asynchronous sampling rate conversion rate R is too close to 1, it would jeopardize the noise shaping ability of the Σ-δ modulator 1066.

The Σ-δ modulator 1066 generates the gated clock CLK_G according to the asynchronous sampling rate conversion rate R and the asynchronous sampling rate conversion clock CLK_A, wherein the gated clock CLK_G is a one-bit sequence; over time, the frequency of the gated clock CLK_G equals the product of the frequency of the asynchronous sampling rate conversion clock CLK_A and the asynchronous sampling rate conversion rate R; that is, for the frequency fg the thus-generated gated clock CLK_G, fg=the asynchronous sampling rate conversion rate R*the asynchronous sampling rate conversion clock CLK_A, i.e., ((fp/fl)/(1+MH))*(fl*(1+MH))=fp, thereby, the frequency fg of the gated clock CLK_G is the same as the frequency fp of the peer end clock CLK_P. The level of jitter of the gated clock CLK_G relates to the value of the pre-determined margin for frequency rise MH, wherein the greater the pre-determined margin for frequency rise MH, the better the fineness, and the less the jitter of the gated clock CLK_G.

Because the Σ-δ modulator 1066 can shape noises, and since the Σ-δ modulator 1066 utilizes a higher over-sampling rate for sampling rate conversion, it achieves a better performance in a simpler way, Specifically, the sampling rate conversion noise introduced by the Σ-δ modulator 1066 locates at a higher frequency, which is separate from the baseband signal band; that is, the sampling rate conversion noise introduced by the Σ-δ modulator 1066 can be inhibited individually using a back-end circuit without affecting the baseband signal. In the present embodiment, the Σ-δ modulator 1066 is a one-bit Σ-δ modulator; however, the present application is not limited thereto. In the present embodiment, the digital signal processing unit 108 asynchronous sampling architecture generates the read control signal rctrl1 according to the gated clock CLK_G; reads the first input data string d1 from the first register 102 according to the read control signal rctrl1; performs any digital signal processing on the first output data string d1ff; and generates output data string d1dsp that has been subject to the digital signal processing.

Figure 3:
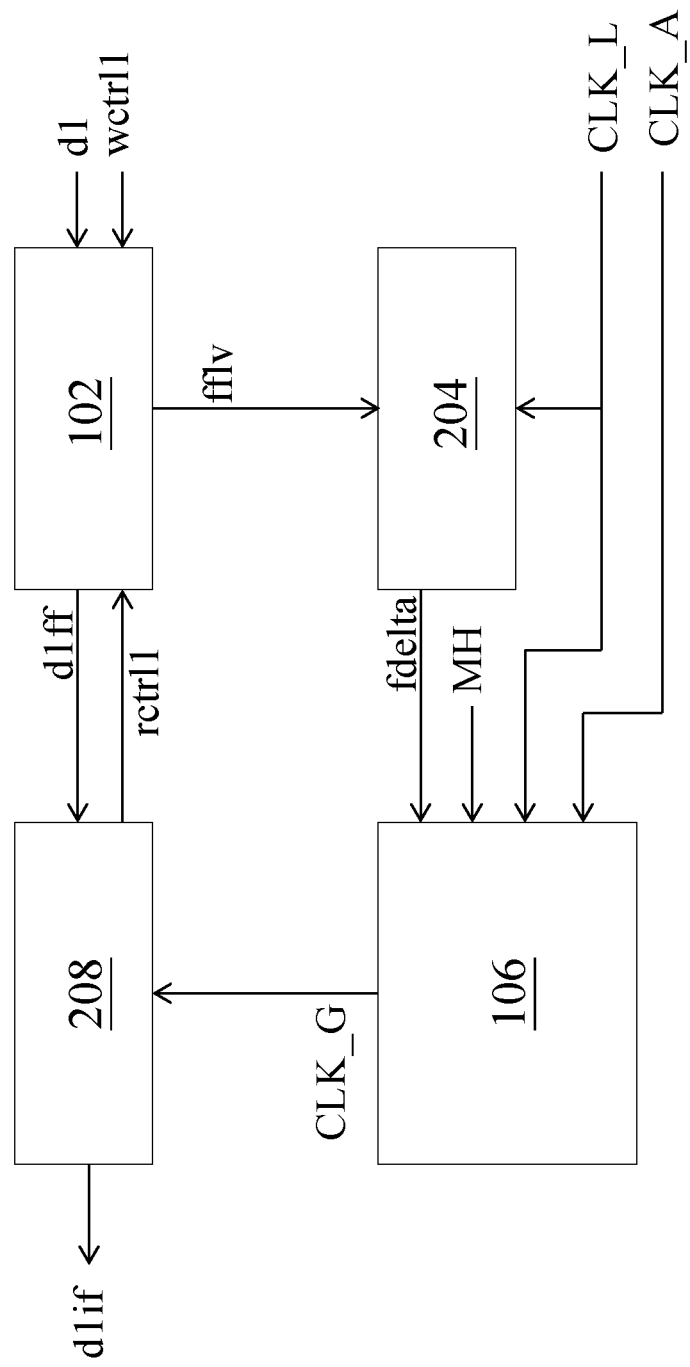
FIG. 3 is a schematic diagram illustrating an asynchronous sampling architecture according to the second embodiment of the present application.

FIG. 3 is a schematic diagram illustrating an asynchronous sampling architecture according to the second embodiment of the present application. Compared with the asynchronous sampling architecture 100 shown in FIG. 1, the asynchronous sampling architecture 200 shown in FIG. 3 further includes a frequency difference estimation unit 204, and more specifically, the digital signal processing unit 108 can be implemented with the interpolation filter 208. The frequency difference estimation unit 204 estimates the first frequency difference fdelta between the peer end clock CLK_P and the local clock CLK_L according to the amount of storage fflv used in the first register 102, as discussed above, fdelta=the frequency fp of the peer end clock CLK_P–the frequency fl of the local clock CLK_L. Specifically, the frequency difference estimation unit 204 estimates the first frequency difference fdelta according to the storage fflv used in the first register 102 and the local clock CLK_L. For example, in some embodiments, the frequency difference estimation unit 204 generates the first frequency difference fdelta according to the storage change of the first register 102 that the local clock CLK_L obtains within a pre-determined period. For example, the storage change can be obtained based on the corresponding storage fflv used in the first register 102 obtained respectively at a certain time point and after the passage of 1000 clock cycles of the local clock CLK_L; the present application does not particularly limit the means for implementing the frequency difference estimation unit 204, and the frequency difference estimation unit 204 may be implemented using a hardware, software, or firmware. The greater the variation in the storage, the greater the first frequency difference fdelta between the peer end clock CLK_P and the local clock CLK_L, and vice versa, in the present application, the means for implementing the frequency difference estimation unit 204 is not limited hereto, as long as the same or similar purpose can be achieved.

The interpolation filter 208 performs interpolation filtering process on the first output data string d1ff read from the first register 102 according to the gated dock CLK_G and generates an interpolation filter output data string d1if, so as to allow the signal band keeping clean. In some embodiments, the interpolation filter 208 can be substituted with any baseband digital signal processing circuit.

Figure 4:
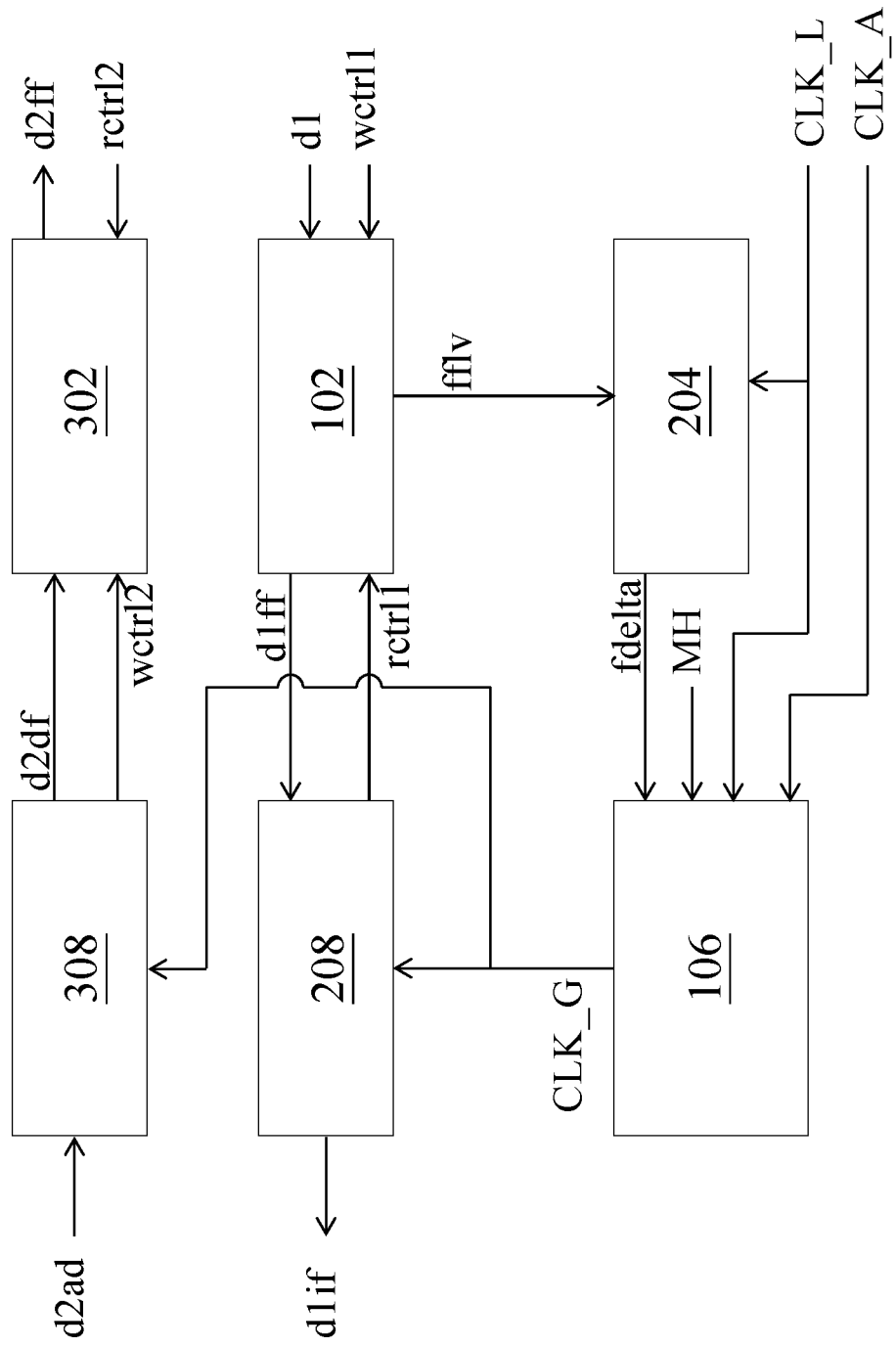
FIG. 4 is a schematic diagram illustrating an asynchronous sampling architecture according to the third embodiment of the present application.

FIG. 4 is a schematic diagram illustrating an asynchronous sampling architecture according to the third embodiment of the present application. Compared with the asynchronous sampling architecture 200 shown in FIG. 3, the asynchronous sampling architecture 300 shown in FIG. 4 further includes a second register 302 and a decimation filter 308, wherein the second register 302 may be a first-in-first-out register, which is configured to buffer a second input data string d2df. The decimation filter 308 generates a write control signal wcrtl2 according to the gated clock CLK_G and writes the second input data string d2df into the second register 302 according to write control signal wcrtl2; the peer end generates a read control signal rcrtl2 according to the peer end clock CLK_P and reads the second input data string d2df from the second register 302 as a second output data string d2ff according to the read control signal rcrtl2. Similar to the first register 102, since the frequency of the gated clock CLK_G is the same as the frequency of the peer end clock CLK_P, the second register 302 will not suffer from issues such as overflow or underflow. In the present embodiment, the decimation filter 308 performs decimation filtering process on the decimation filter input data string d2ad according to the gated clock CLK_G and generates the second input data string d2df, so as to avoid the generation of signal aliasing. In some embodiments, the decimation filter 308 can be substituted with any baseband digital signal processing circuit.

Figure 5:
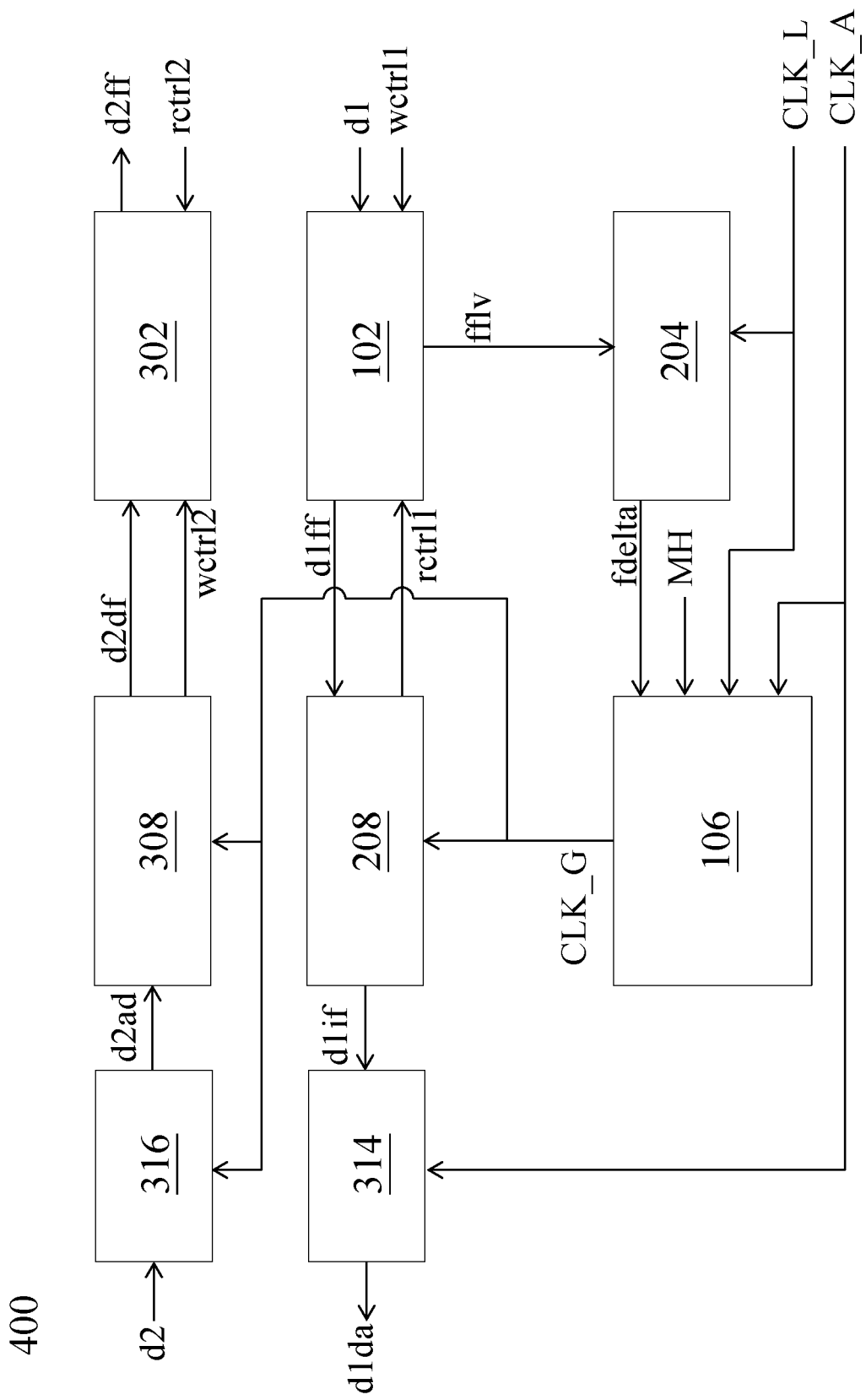
FIG. 5 is a schematic diagram illustrating an asynchronous sampling architecture according to the fourth embodiment of the present application.

FIG. 5 is a schematic diagram illustrating an asynchronous sampling architecture according to the fourth embodiment of the present application. Compared with the asynchronous sampling architecture 300 shown in FIG. 4, the asynchronous sampling architecture 400 shown in FIG. 5 further includes a digital-to-analog converter 314, which performs digital-to-analog conversion on the interpolation filter output data string d1if according to the asynchronous sampling rate conversion clock CLK_A and outputs the analog signal d1da. The asynchronous sampling architecture 400 shown in FIG. 5 further includes an analog-to-digital converter 316, wherein the analog-to-digital converter 316 performs analog-to-digital on the analog-to-digital input data string d2 according to the gated clock CLK_G and generates a decimation filter input data string d2ad. For example, the present embodiment is applicable in a Bluetooth headphone system, wherein the peer end transmits the first input data string d1 to the asynchronous sampling architecture 400 via Bluetooth, and the asynchronous sampling architecture 400 transmits the outputted analog signal d1da to the headphone speaker (not shown in the drawings) for playback via the digital-to-analog converter 314. Conversely, the asynchronous sampling architecture 400 generates the analog-to-digital input data string d2 via the microphone (not shown in the drawings) and converts the analog-to-digital input data string d2 into the digital domain via the analog-to-digital converter 316 and uses the peer end to read out the second output data string d2ff. All data in the present embodiment can be single-bit or multi-bit, the specific bit number may be determined depending on the size of data.

The present application further provides a chip, which includes an asynchronous sampling architecture 100/200/300/400.

The present application embodiment improves the asynchronous sampling architecture by using the Σ-δ modulation to generate the gated clock for asynchronous sampling rate conversion, instead of using the asynchronous sampling rate converter to perform resampling on the signal with the local clock; the conventional asynchronous sampling rate converter often requires high-bit multiplication calculation; since the circuit using the Σ-δ modulation according to the present asynchronous sampling architecture to generate the gated clock is much simpler in terms of the computation complexity with respect to the circuit for performing resampling on signal using the local clock of the asynchronous sampling rate converter, embodiments of the present application greatly reduces the hardware size and power consumption compared with conventional asynchronous sampling rate converters.

The foregoing outlines the features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of embodiments introduced herein. Those skilled in the art should also realize that such equivalent embodiments still fall within the spirit and scope of the present disclosure, and they may make various changes, substitutions, and alterations thereto without departing from the spirit and scope of the present disclosure.

What is claimed is:

1. An asynchronous sampling architecture, configured to receive a first input data string from a peer end, wherein the asynchronous sampling architecture comprises:

a first register, configured to buffer the first input data string, wherein the first input data string is written into the first register according to a peer end clock of the peer end; and a gated clock generation unit, configured to generate a gated clock, wherein the frequency of the gated clock is the same as the frequency of the peer end clock, and the first input data string is read out from the first register as a first output data string according to the gated clock;

wherein the gated clock generation unit generates the gated clock according to a first frequency difference between the peer end clock and a local clock of the asynchronous sampling architecture, a pre-determined margin for frequency rise, the local clock and an asynchronous sampling rate conversion clock, wherein the frequency of the asynchronous sampling rate conversion clock is greater than the frequency of the local clock, and a second frequency difference between the frequency of the asynchronous sampling rate conversion clock and the frequency of the local clock is the product of the frequency the local clock and the pre-determined margin for frequency rise.

2. The asynchronous sampling architecture of claim 1, wherein the gated clock generation unit comprises:

an asynchronous sampling rate conversion rate generation unit, configured to generate an asynchronous sampling rate conversion rate according to the first frequency difference and the pre-determined margin for frequency rise; and a Σ-δ modulator, configured to generate the gated clock according to the local clock, the asynchronous sampling rate conversion rate and the asynchronous sampling rate conversion clock.

3. The asynchronous sampling architecture of claim 2, wherein the Σ-δ modulator is a one-bit Σ-δ modulator.

4. The asynchronous sampling architecture of claim 1, wherein the difference between the frequency of the asynchronous sampling rate conversion clock and the frequency of the local clock is the product of the frequency of the local clock and the pre-determined margin for frequency rise.

5. The asynchronous sampling architecture of claim 1, further comprising a frequency difference estimation unit, configured to estimate the first frequency difference according to an amount of storage used in the first register.

6. The asynchronous sampling architecture of claim 5, wherein the frequency difference estimation unit estimates the first frequency difference according to the amount of storage used in the first register and the local clock.

7. An asynchronous sampling architecture, configured to receive a first input data string from a peer end, wherein the asynchronous sampling architecture comprises:

a first register, configured to buffer the first input data string, wherein the first input data string is written into the first register according to a peer end clock of the peer end; and a gated clock generation unit, configured to generate a gated clock, wherein the frequency of the gated clock is the same as the frequency of the peer end clock, and the first input data string is read out from the first register as a first output data string according to the gated clock, wherein the gated clock generation unit generates the gated clock according to a first frequency difference between the peer end clock and a local clock of the asynchronous sampling architecture;

a frequency difference estimation unit, configured to estimate the first frequency difference according to an amount of storage used in the first register, wherein the frequency difference estimation unit estimates the first frequency difference according to the amount of storage used in the first register and the local clock;

wherein the frequency difference estimation unit obtains a storage change in the first register within a pre-determined period according to the local clock, and estimates the first frequency difference according to the pre-determined period and the storage change.

8. The asynchronous sampling architecture of claim 1, further comprising an interpolation filter, configured to generate a read control signal according to the gated clock, so as to read the first input data string from the first register and perform an interpolation filtering process and generate an interpolation filter output data string.

9. The asynchronous sampling architecture of claim 8, further comprising a digital-to-analog converter, configured to perform a digital-to-analog conversion on the interpolation filter output data string according to the asynchronous sampling rate conversion clock.

10. An asynchronous sampling architecture, configured to receive a first input data string from a peer end, wherein the asynchronous sampling architecture comprises:
a first register, configured to buffer the first input data string, wherein the first input data string is written into the first register according to a peer end clock of the peer end; and
a gated clock generation unit, configured to generate a gated clock, wherein the frequency of the gated clock is the same as the frequency of the peer end clock, and the first input data string is read out from the first register as a first output data string according to the gated clock; and
a second register, configured to buffer a second input data string, wherein the second input data string is written into the second register according to the gated clock, the second input data string is read from the second register as a second output data string according to the peer end clock, and the peer end receives the second output data string from the asynchronous sampling architecture.

11. The asynchronous sampling architecture of claim 10, further comprises a decimation filter, configured to perform a decimation filtering process on a decimation filter input data string according to the gated clock and generate the second input data string, and generate a write control signal according to the gated clock, and write the second input data string into the second register according to the write control signal.

12. The asynchronous sampling architecture of claim 11, further comprising an analog-to-digital converter, configured to perform an analog-to-digital conversion on an analog-to-digital input data string according to the gated clock and generate the decimation filter input data string.

13. The asynchronous sampling architecture of claim 1, wherein the first register is a first-in-first-out register.

14. The asynchronous sampling architecture of claim 10, wherein the second register is a first-in-first-out register.

15. The asynchronous sampling architecture of claim 1, wherein the pre-determined margin for frequency rise is greater than 0 and less than 1.

16. The asynchronous sampling architecture of claim 1, wherein the pre-determined margin for frequency rise is no less than 0.1 and no greater than 0.2.

* * * * *